United States Patent
Nakamichi et al.

[11] Patent Number: 6,100,773
[45] Date of Patent: Aug. 8, 2000

[54] IMPEDANCE MATCHING DEVICE

[75] Inventors: Masumi Nakamichi, Tenri; Yoshiyuki Masuda, Noda, both of Japan

[73] Assignee: Sharp Kabushiki Kaisha, Osaka, Japan

[21] Appl. No.: 09/157,245

[22] Filed: Sep. 18, 1998

[30] Foreign Application Priority Data

Oct. 7, 1997 [JP] Japan ..................... 9-274749

[51] Int. Cl.⁷ .................................. H03H 7/38
[52] U.S. Cl. ................ 333/32; 333/33; 361/281
[58] Field of Search ............... 333/32, 172, 33; 331/177 V; 361/277, 281, 766

[56] References Cited

U.S. PATENT DOCUMENTS

| | | | |
|---|---|---|---|
| 2,830,274 | 4/1958 | Rosen et al. | 333/32 X |
| 2,907,957 | 10/1959 | Dewitz | 333/32 X |
| 4,473,806 | 9/1984 | Johnston | 361/281 X |
| 5,339,211 | 8/1994 | Pernisz et al. | 361/281 X |
| 5,561,407 | 10/1996 | Koscica et al. | 333/161 |
| 5,771,148 | 6/1998 | Davis | 361/281 |
| 5,920,454 | 7/1999 | Nomura et al. | 361/766 X |

FOREIGN PATENT DOCUMENTS 7-303003A 11/1995 Japan .
94/13028 6/1994 WIPO .

OTHER PUBLICATIONS

"Precursor Dependent Properties of $Ba_{1-x}Sr_xTiO_3$ Thin Films Fabricated By Sol–Gel Method", J. Kim et al., Proceedings of IEEE International Symposium on Applications of Ferroelectrics (CAT. No. 94CH3416–5); Aug. 7–10, 1994; pp. 423–426.

Primary Examiner—Paul Gensler

[57] ABSTRACT

An impedance matching device includes a variable capacitor constituted by a non-linear dielectric thin film and an upper electrode disposed on a lower electrode formed on a substrate. The non-linear dielectric thin film is formed by a deposition, screen-printing, electroplating, or other technique, and changes its relative dielectric constant according to applied voltage. Therefore, the capacity of the variable capacitor is controlled and the impedance is matched, by simply controlling the applied voltage across the non-linear dielectric thin film. Consequently, the arrangement makes it possible to cut down the impedance matching device in size and cost, compared to an arrangement incorporating a capacitor and a coil for adjustment, effects a much simpler matching operation, and facilitates a manufacturing process.

20 Claims, 9 Drawing Sheets

IMPEDANCE MATCHING DEVICE

FIELD OF THE INVENTION

The present invention relates to an impedance matching device suitably used for an impedance matching antenna, directional antenna, etc. incorporated in a high frequency wireless device, satellite broadcast receiver, wireless LAN system, and other radio high frequency devices handling signals in a frequency range of about 400 MHz to 20 GHz (from the UHF to SHF band).

BACKGROUND OF THE INVENTION

Many efforts have recently been made to minimize the sizes and prices, and at the same time maximize the function, of high frequency devices including a high frequency wireless device, satellite broadcast receiver, and a wireless LAN system. Accordingly, demands are high for smaller, thinner, and cheaper electronics components for high frequency circuits incorporated in those devices. In addition, a protrusion, such as an antenna, on a portable device is not a desirable feature for aesthetic and portability reasons.

In a move to respond to these demands, dielectric ceramic small block antennas have been introduced into market.

Nevertheless, the dielectric ceramic small block antenna has an antenna pattern formed directly on a dielectric, providing a relatively narrow sensitive band width. Also, if the user carries the antenna in his hand and holds it close to his ear, the antenna is affected by the human body in terms of dielectric constant. The result is a disturbed electromagnetic field and a mismatched impedance, which in turn cause trouble in communications. To prevent such a problem from happening, the antenna is connected to a high frequency circuit via an impedance matching device.

Furthermore, since the high frequency circuit generally contains a distribution constant circuit that handles mismatching of the impedance, an unexpected electromagnetic coupling may possibly occur between a signal line and a closely placed GND line. The distribution constant circuit in some cases has an unexpected coupling capacity between wiring lines due to irregularity in dimensions of the wiring pattern and other reasons. These are causes for the disruption of the impedance from being matched in the high frequency circuit.

The irregularity in dimension precision of the wiring pattern (circuit pattern) needs to be solved by trimming and improvement in the precision of the print pattern of the distribution constant circuit. Therefore, strict control is needed on the length of lead wires and the amount of solder when electronics components are mounted. As briefly illustrated here, the distribution constant circuit for impedance matching has a problem that high precision is demanded in its manufacturing process.

The high frequency circuit therefore very often includes an impedance matching device between circuit blocks as well as in the connection with the antenna, since the inclusion reduces reflected waves and better transmits signals.

A conventional impedance matching device installed in high frequency circuits is typically large in size because of a capacitor and a coil incorporated therein for adjustment.

Moreover, so as to impart the characteristics required by the circuit module to the impedance matching device, consideration needs to be paid to the applicable temperature range and the temperature characteristics of various components in the design of the circuit. Skilled engineers and their experiences were essential to such a design process. Should the design fail to produce desirable characteristics, complex adjustment such as trimming is inevitable.

Therefore, conventional impedance matching devices have a problem of complex design and manufacturing processes and accompanying high costs.

SUMMARY OF THE INVENTION

An object of the present invention is to offer an impedance matching device of a small size, low manufacturing cost and simple impedance matching capability.

In order to accomplish the object, the impedance matching device in accordance with the present invention includes:

a voltage-controlled variable capacitor, for receiving an input signal, including,
a non-linear dielectric thin film having a relative dielectric constant in accordance with a strength of an applied electric field,
a first electrode formed on one of the sides of the non-linear dielectric thin film, and
a second electrode formed on the opposite side of the non-linear dielectric thin film; and a control voltage application section for applying a control voltage across the first and second electrodes.

The impedance matching device is, for example, mounted on a high frequency circuit substrate. The impedance matching device is arranged so that an input signal, such as a high frequency signal, is sent to the voltage-controlled variable capacitor.

The voltage-controlled variable capacitor is arranged so that the relative dielectric constant of the non-linear dielectric thin film varies as the DC control voltage is applied across the first and second electrodes, that the capacity of the voltage-controlled variable capacitor then varies according to the variation in the relative dielectric constant, and that the impedance of the path of the input signal is in accordance with that variation in the capacity.

Therefore, with the arrangement, the impedance can be matched to the desirable value, by simply controlling the control voltage according to the high frequency signal that is coupled to the voltage-controlled variable capacitor and flows through the first and second electrodes.

A conventional impedance matching circuit is arranged to include chip components, such as a coil, capacitor, and resistor, incorporated on a ceramic substrate. However, such an arrangement requires replacement of the chip components and physical adjustment to match impedances between circuit blocks.

By contrast, the impedance matching device in accordance with the present invention can always produce the desirable impedance simply by the control voltage application section changing the control voltage according to temperature variations and effects from the user. This facilitates design and adjustment of high frequency circuits.

In addition, the non-linear dielectric thin film is preferably made of an oxidized material such as $BaTiO_3$, $SrTiO_3$, or $BaSrTiO_3$. The use of such a material can form the non-linear dielectric thin film on a ceramic substrate that produces little signal delay and that is suitable for a high frequency circuit substrate, by baking integrally with other passive parts such as a capacitor, coil, and resistor. This makes it possible to cut down the impedance matching device in size and cost.

For a fuller understanding of the nature and advantages of the invention, reference should be made to the ensuing detailed description taken in conjunction with the accompanying drawings.

DESCRIPTION OF THE EMBODIMENTS

The following description will discuss a first embodiment in accordance with the present invention.

Figure 1:
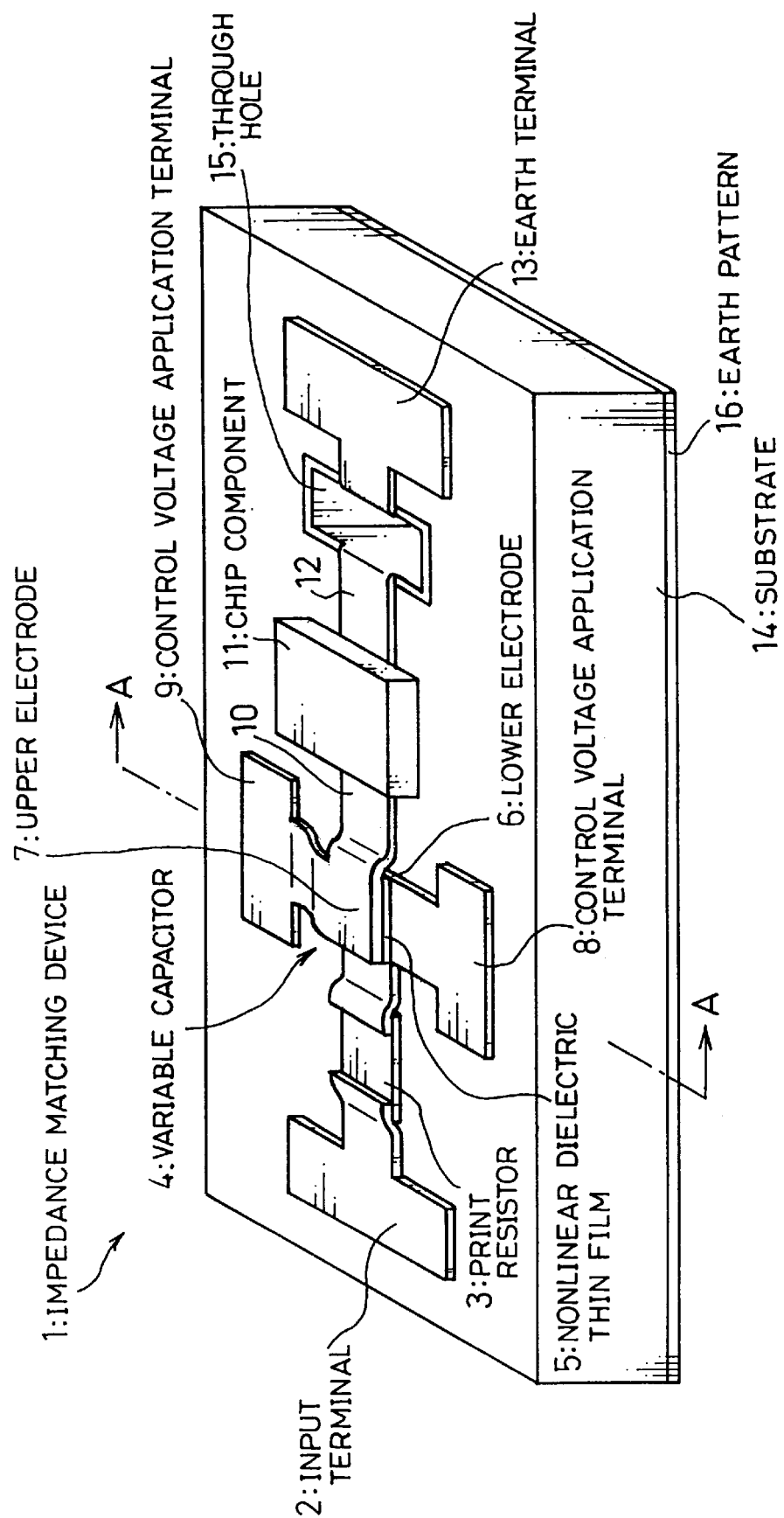
FIG. 1 is a perspective view showing an impedance matching device of the first embodiment in accordance with the present invention.
Figure 2:
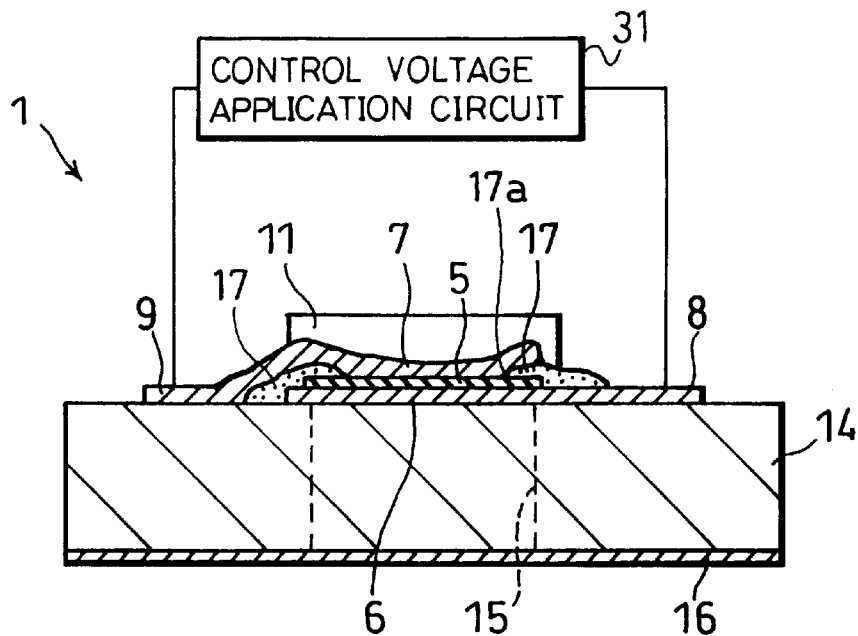
FIG. 2 is an explanatory view showing the cross-sectional view taken along line A—A of the impedance matching device shown in FIG. 1.
Figure 3:
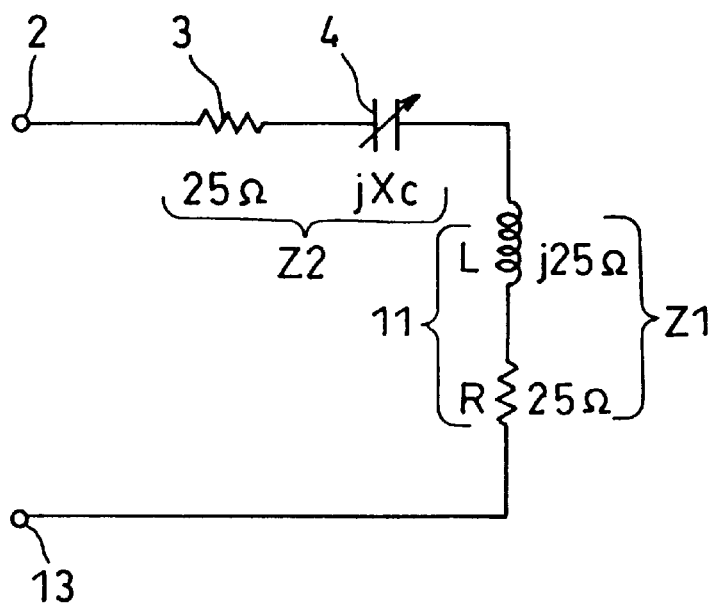
FIG. 3 is an explanatory diagram showing an equivalent circuit for the impedance matching device shown in FIG. 1.

FIG. 1 is a perspective view showing the structure of an impedance matching device 1 of an embodiment in accordance with the present invention. FIG. 2 is a cross-sectional view of the impedance matching device 1 taken along line A—A shown in FIG. 1. FIG. 3 is an explanatory diagram showing an equivalent circuit for the impedance matching device 1.

The impedance matching device 1 is connected to, for example, an impedance matched antenna or directional antenna or disposed between high frequency circuits. FIGS. 1 to 3 do not show structure of peripheral circuits of the impedance matching device 1.

In the impedance matching device 1, high frequency signals are input to a variable capacitor (voltage-controlled variable capacitor) 4 via an input terminal 2 and a print resistor 3 and output from a control voltage application terminal 9 and an earth terminal 13.

The variable capacitor 4 includes a non-linear dielectric thin film 5 flanked by first and second electrodes 6 and 7. The lower electrode 6 is connected to a control voltage application terminal 8 and the print resistor 3. The upper electrode 7 is connected to the control voltage application terminal 9 and an input terminal of a chip component 11 via a wiring pattern 10.

The control voltage application terminals 8 and 9 are connected to a control voltage application circuit (control voltage application section) 31, which generates a predetermined control voltage to apply across the control voltage application terminals 8 and 9. The chip component 11 is a load element having an inductor L and a resistor component R. The output terminal of the chip component 11 is connected to the earth terminal 13 via a wiring pattern 12.

The earth terminal 13 is connected via a through hole 15 formed through a substrate 14 to an earth pattern 16 formed on the opposite surface of the substrate 14. The substrate (high frequency circuit substrate) 14 is a multi-layer wiring substrate formed by baking, for example, glass materials and ceramic materials containing titanium oxide and barium oxide as main components. Inside the substrate 14, there are other high frequency circuits including a filter circuit.

An electric field of about 1 MV/cm is arranged to be applied across the non-linear dielectric thin film 5. The power supply voltage is set to range, for example, from 5V to 10V, because of the demand for lower voltage with portable devices. For this reason, the non-linear dielectric thin film 5 needs to have a thickness of 0.1 $\mu$m to 0.2 $\mu$m.

The electrodes 6 and 7 are formed, taking the skin thickness thereof into consideration because the electrodes 6 and 7 handle high frequencies. So the electrodes 6 and 7 are 6 $\mu$m to 7 $\mu$m thick films. A thick film formed with the skin thickness thereof taken into consideration can be defined as follows: Typically, a high frequency signal tends to travel near the surface of a conductive body. The tendency becomes more evident as the frequency of the signal becomes higher. In other words, a thick film formed with the skin thickness thereof taken into consideration is a film having a proper thickness according to the frequency range of high frequency signals to be handled.

The impedance matching device 1 is, as explained above, constituted by both a thick film and a thin film. Therefore, the non-linear dielectric thin film 5 can be formed as a thin film by a deposition, printing, or sol-gel technique using an organic metal salt. FIGS. 1 and 2 show an example of the non-linear dielectric thin film 5 formed by a MOD (Molecular Oxide Deposition) technique. The MOD technique is one of the printing techniques and capable of forming uniform non-linear dielectric thin films.

According to the MOD technique, MOD in a gel form is printed using a screen mask and then baked. The technique can coat a flat surface with a very uniform non-linear dielectric thin film, but fails to substantially cover up a step at an edge portion of the thick lower electrode 6 which acts as a bed, causing partial irregularity in the film thickness. This causes short-circuit of the electrodes 6 and 7, an increased leak current, and an abnormal insulation withstand voltage. In addition, the capacity may become irregular.

Therefore, as shown in FIG. 2, the impedance matching device 1 has an insulating film 17 formed on an edge portion of the lower electrode 6. The insulating film 17 is composed of a material having a substantially low relative dielectric constant, such as $SiO_2$ or $Al_2O_3$, compared to the non-linear dielectric thin film 5, and laid to form a thickness of not less than 2 $\mu$m. The upper electrode 7 is disposed in the opening 17a in the insulating film 17 in FIG. 2. The insulating film 17 and the control voltage application circuit 31 are omitted from FIG. 1 for simplicity of the drawing.

Figure 4:
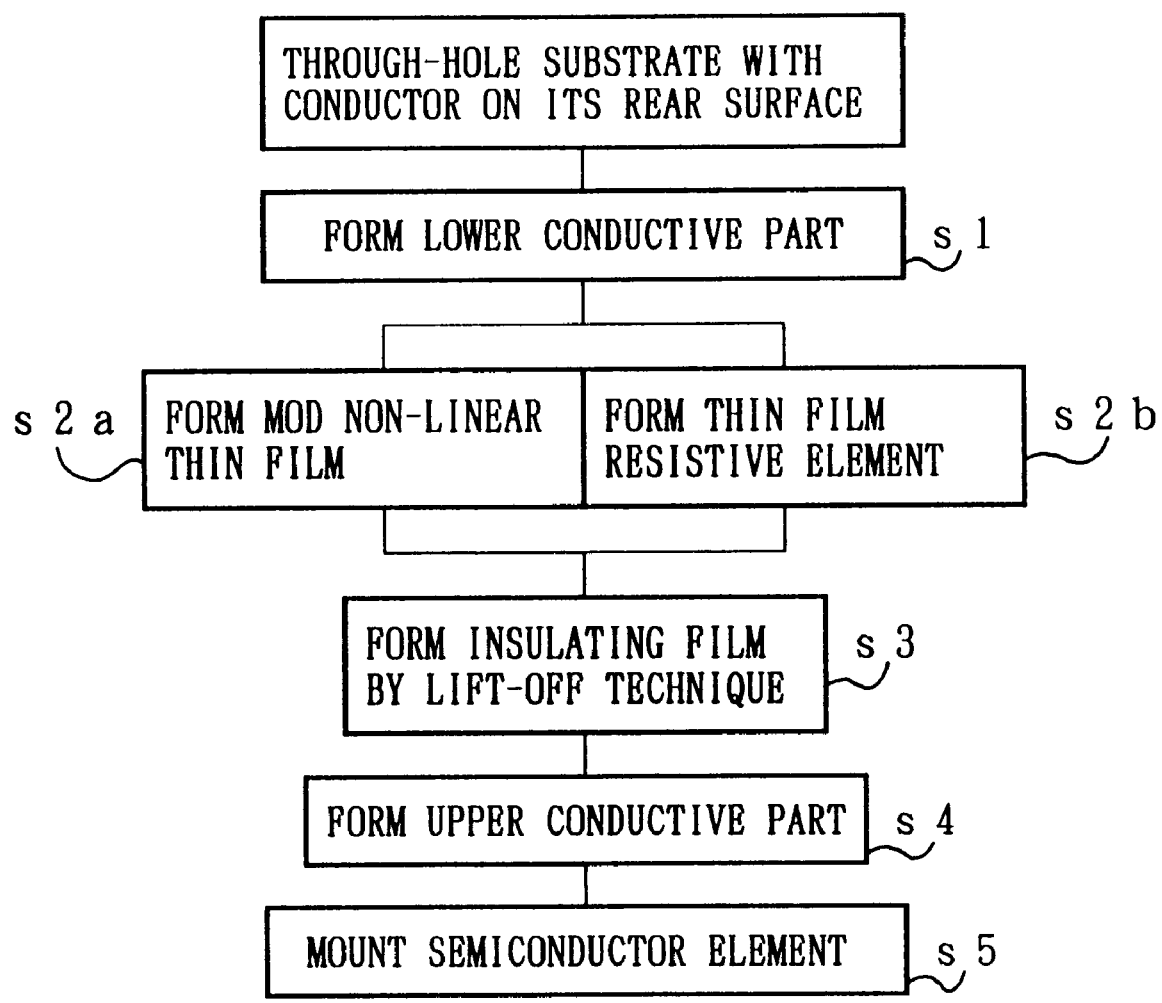
FIG. 4 is a flow block diagram showing operations of fabricating the impedance matching device shown in FIG. 1 on a substrate.

The following description will explain a manufacturing process of the impedance matching device 1 arranged as above. FIG. 4 is a flow block diagram explaining the manufacturing process. As shown in FIG. 4, the manufacturing process of the impedance matching device 1 starts with Step s1, forming as a thick film a lower conductive part including the lower electrode 6 on the substrate 14 having the through hole 15 and the earth pattern 16. The lower conductive part is formed using one of, or a combination of, conductor paste, electroplating, and other techniques.

In Step s2a, the non-linear dielectric thin film 5 is formed by screen-printing and baking, for example, the MOD above. In Step s2b, the print resistor 3 is formed as shown in FIG. 1 by thin-film-printing.

The process proceeds to Step s3 after Step s2a and Step s2b are completed. In Step s3, the part of the non-linear dielectric thin film 5 that extends beyond the bounds of the lower electrode 6 is removed by a lift-off technique. A material that can be easily etched chemically, such as photoresist and Al, is used for the removal by the lift-off technique. The insulating film 17 is formed, also in Step s3, on an outer edge of an area that will act as the variable capacitor 4 by, for example, a spin coat or deposition technique.

In Step s4, an upper conductive part including the upper electrode 7 and the wiring pattern 10 is formed as a thick film. The upper conductive part is formed, similarly to the lower conductive part, using one of, or a combination of, printing, electroplating, and other techniques. Thereafter, in Step s5, a chip component 11 is mounted as shown in FIGS. 1 and 2, which completes the manufacturing process of the impedance matching device 1.

Figure 5:
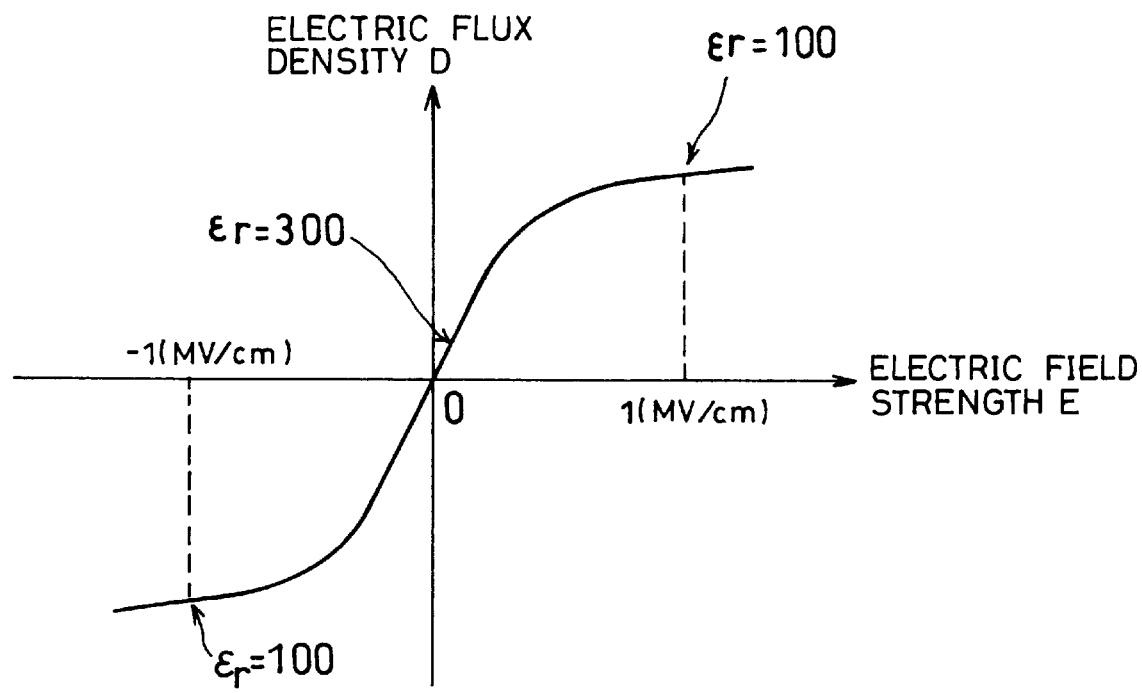
FIG. 5 is a graph showing changes in the electric flux density of the non-linear dielectric thin film of the impedance matching device shown in FIG. 1 in response to changes in the electric field strengths applied thereacross.

The following description will explain impedance matching properties of the impedance matching device 1. FIG. 5 is a graph showing changes in the electric flux density D in the non-linear dielectric thin film 5 in response to changes of the voltage strengths applied thereacross. As the control voltage application circuit 31 shown in FIG. 2 applies a DC control voltage across the electrodes 6 and 7 via the control voltage application terminals 8 and 9, an electric field is generated across the non-linear dielectric thin film 5, and the electric flux density D across the non-linear dielectric thin film 5 changes with the electric field strength E as shown in FIG. 5.

Figure 6:
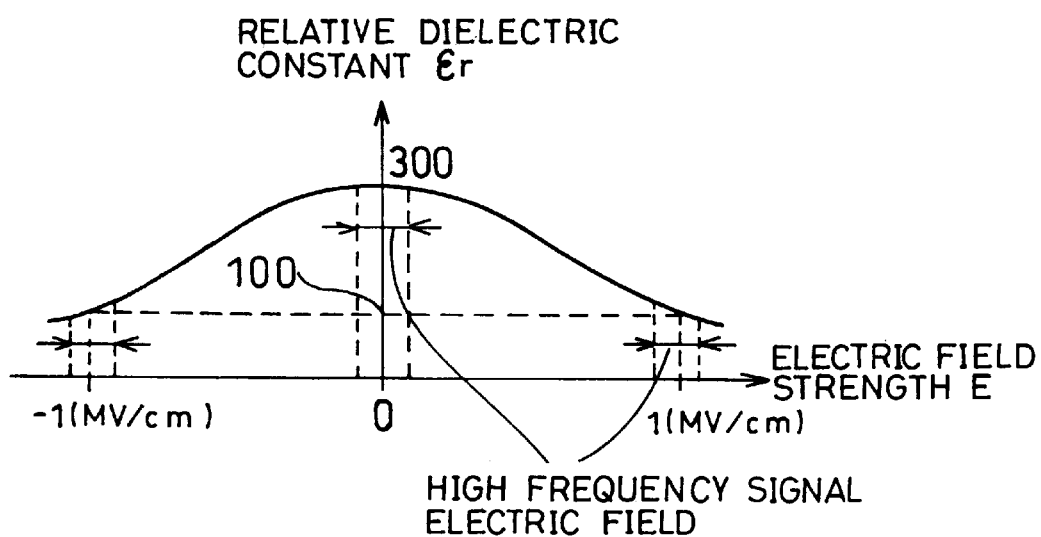
FIG. 6 is a graph showing changes in the relative dielectric constant of the non-linear dielectric thin film of the impedance matching device shown in FIG. 1 in response to changes in the electric field strengths applied thereacross.

FIG. 6 is a graph showing changes in the relative dielectric constant of the non-linear dielectric thin film 5 in response to changes in the voltage strengths applied thereacross. As the graph shows, the relative dielectric constant εr is, for example, about 300 in the vicinity of E=0 MV/cm where the electric field strength E is weak, and 100 at E=±1 MV/cm where the electric field strength E is strong. It is therefore understood that the relative dielectric constant εr of the non-linear dielectric thin film 5, i.e., the capacity of the variable capacitor 4, can change more than 60% by changing the applied electric field.

The following description will explain an example of the control of the capacity of the variable capacitor 4 required for impedance matching. As FIG. 3 shows, the impedance matching device 1 is arranged to match the impedance with the chip component 11, i.e. a load element, connected in series to a DC circuit that includes the print resistor 3 and the variable capacitor 4. Referring to the Smith chart in FIG. 7, the following description will explain in detail the capacity required with the variable capacitor 4 of the impedance matching device 1 of such an arrangement.

It is assumed in the description below that the characteristic impedance Zc of the impedance matching device 1 is designed to be 50Ω. It is also assumed, as shown in FIG. 3, that the resistance of the print resistor 3 is 25Ω, the inductance of the inductor L of the chip component 11 is j25Ω, and the resistance of the resistor component R is 25Ω, where j represents the imaginary unit.

In the description below, the reactance of the variable capacitor 4 will be referred to as Xc, and the real impedance of the impedance matching device 1 will be referred to as Z.

In such a case, the load impedance Z1 of the chip component 11 is:

$$Z1=25+j25 (\Omega) \tag{1}$$

The matching impedance Z2 composed of the print resistor 3 and the variable capacitor 4 is:

$$Z2=25-jXc \ (\Omega) \tag{2}$$

Since Zc=50Ω, dividing the impedances Z1 and Z2 above gives the normalized impedances Z1' and Z2' for the impedances Z1 and Z2:

$$Z1'=0.5+j0.5 (\Omega) \tag{3}$$

$$Z2'=0.5-jXc/0.5 (\Omega) \tag{4}$$

Figure 7:
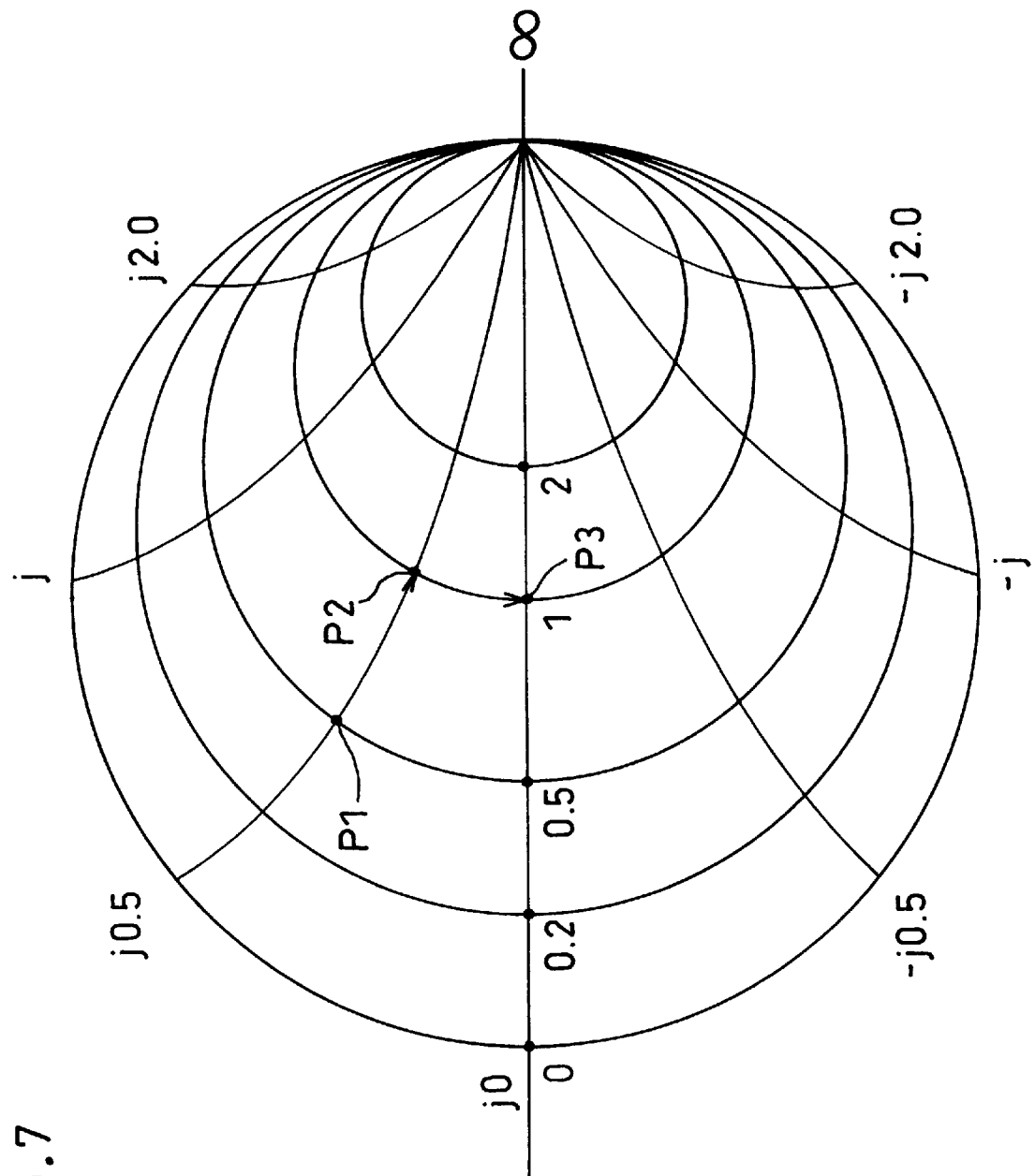
FIG. 7 is an explanatory drawing showing a Smith chart illustrating the process of impedance matching by the impedance matching device shown in FIG. 1.

Z1' in Equation (3) corresponds to Point P1 in the Smith chart in FIG. 7.

The normalized impedance Z' of the impedance matching device 1 is equal to the sum of Z1' and Z2'. Therefore, so as to match the impedance of the impedance matching device 1 to 50Ω, the reactance Xc needs to be determined so that the normalized impedance Z' equals 1.0, i.e.:

$$Z1'+Z2'=1.0 \tag{5}$$

In other words, the reactance Xc needs to satisfy:

$$0.5-Xc/50=0 \tag{6}$$

From Equation (6), Xc=25 is obtained.

Here, supposing that the high frequency signals to be handled have a frequency of, for example, 1 GHz, the capacity C of the variable capacitor 4 satisfies:

$$Xc=1/(\omega C)=1/(2\pi f C) \tag{7}$$

From Equation (7), it is understood that the desirable capacity C of the variable capacitor 4 for impedance matching is about 6.37 pF.

The impedance Z' is moved from Point P1 to Point P2 in FIG. 7 by the print resistor 3 of the insertion impedance Z2, and then on to Point P3 by the variable capacitor 4. The impedance Z' consequently is Z'=1.0, and the impedance Z is matched to Zc=50Ω

Also, as described above, the capacity C of the variable capacitor 4 is variable not less than 60%. Therefore, if the variable capacitor 4 is formed to have a capacity of about 10 pF, the impedance matching device 1 is capable of varying the capacity C of the variable capacitor 4 to about 3.3 pF by applying a control voltage across the variable capacitor 4.

As described above, the impedance matching device 1 is capable of matching the impedance to the predetermined characteristic impedance Zc only by varying, according to the impedance of the chip component 11 that is a load element, the control voltage applied across the variable capacitor 4 by the control voltage application circuit 31.

The control voltage application circuit 31 is constituted, for example, by a voltage dividing resistor disposed between power supply lines and a trim resistor trimmed according to the actually measured load impedance Z1, and generates a predetermined control voltage.

Figure 8:
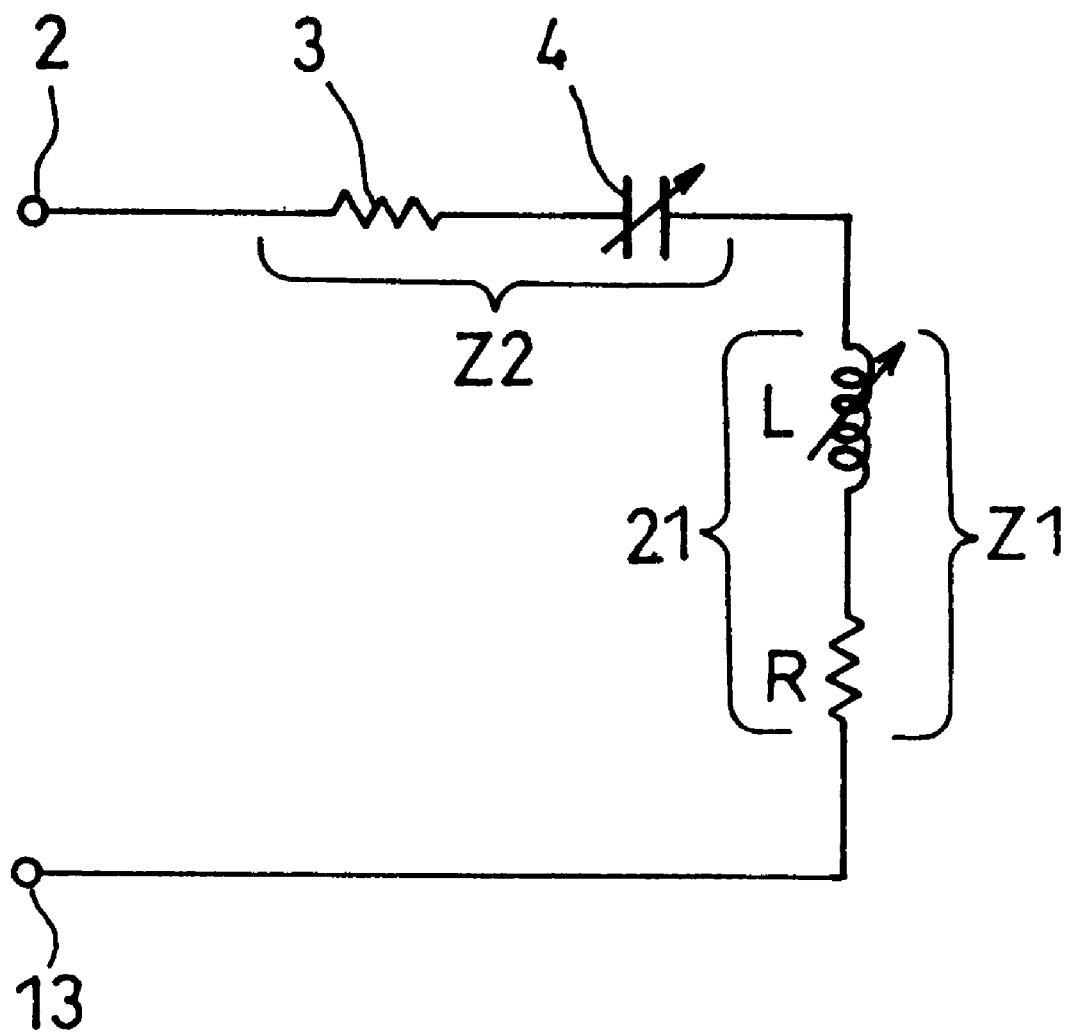
FIG. 8 is an explanatory diagram showing an equivalent circuit for the impedance matching device shown in FIG. 1 to which other chip components are added.

FIG. 8 is an explanatory diagram showing an equivalent circuit for the impedance matching device 1 incorporating a chip component 21 instead of the component chip 11. As FIG. 8 shows, the load impedance Z1 of the chip component 21 varies.

In that arrangement, the control voltage application circuit 31 detects a variation in the load impedance Z1 in the chip component 21 and changes the control voltage. The impedance matching device 1 can maintain the matching of impedance even when the load impedance Z1 of the chip component 21 that is a load element varies.

Figure 9:
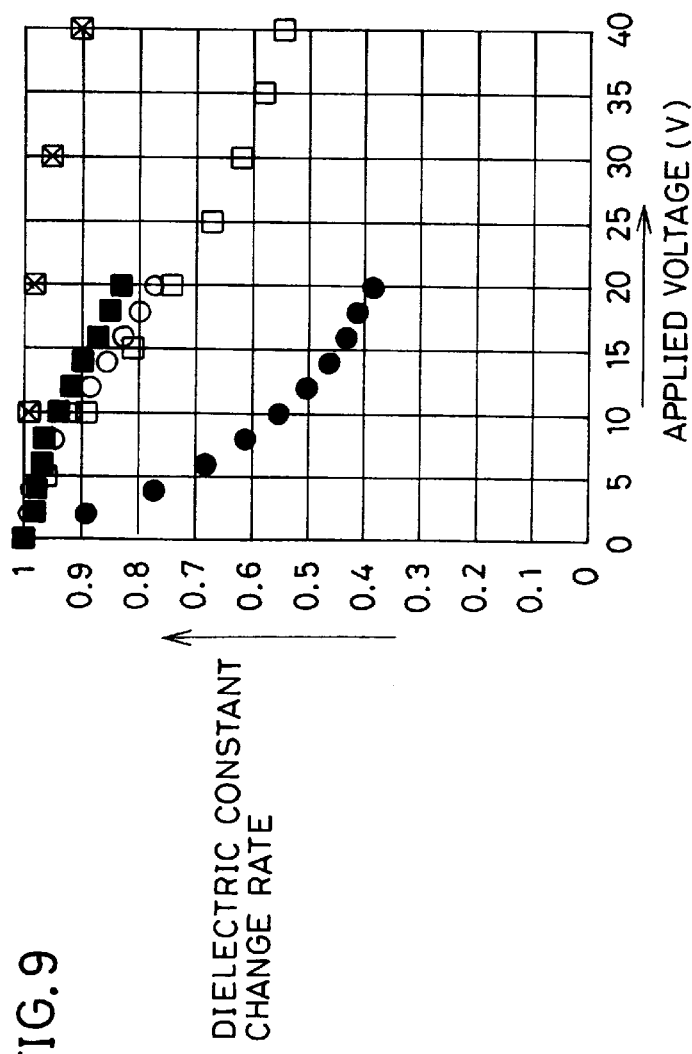
FIG. 9 is a graph showing variations in the dielectric constant change rate of the non-linear dielectric thin film of the impedance matching device shown in FIG. 1 in response to the applied voltage due to differences in material and film forming conditions.

The following description will explain characteristics of the non-linear dielectric thin film 5 and the electrodes 6 and 7 constituting the variable capacitor 4. FIG. 9 is a graph showing variations in the dielectric constant change rate of the non-linear dielectric thin film 5 in response to the applied voltage due to differences in material and film forming conditions for the non-linear dielectric thin film 5.

As clearly understood from the graph, the dielectric constant change rate of the non-linear dielectric thin film 5 varies greatly depending upon film forming conditions such as film forming methods and baking conditions. Note that the dielectric constant change rate here refers to the value of ($\Delta\epsilon r/\epsilon r$) where $\epsilon r$ is the dielectric constant and $\Delta\epsilon r$ is the amount of change of the dielectric constant.

The graph also shows that effectual materials for the non-linear dielectric thin film 5 include STO ($SrTiO_3$) and BST ($Ba_xSr_{1-x}TiO_3$ (0<x<1, e.g. x=0.7). Especially effectual is BST used as the material in combination with a sol-gel technique as the film forming method. Besides STO and BST, BTO ($BaTiO_3$) (not shown in the graph) also is an effectual material and used widely.

Figure 10:
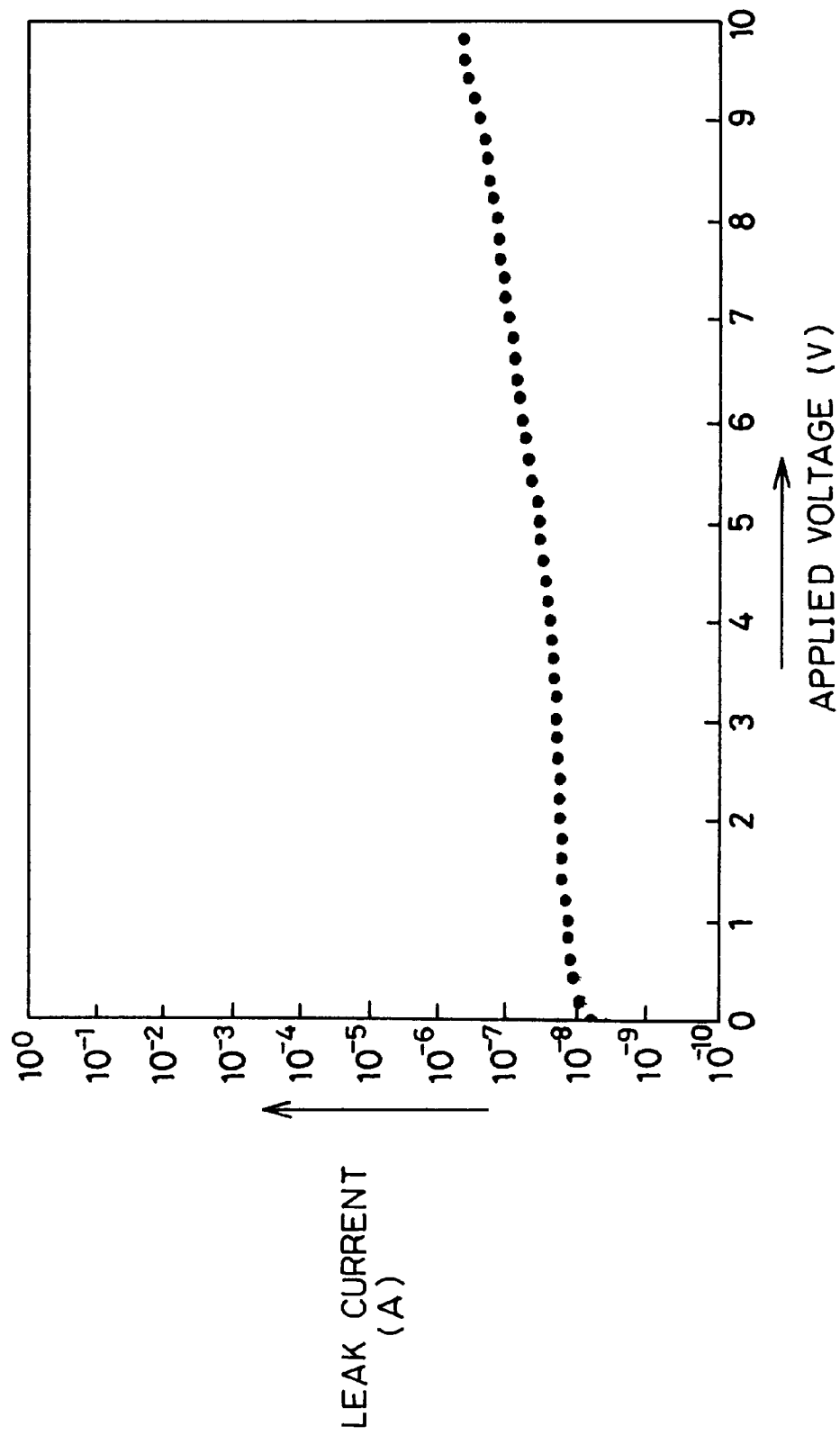
FIG. 10 is a graph showing changes in leak current of the non-linear dielectric thin film in response to the voltage applied thereacross when the thin film is made of a BST film.

FIG. 10 is a graph showing results of measuring the variable capacitor 4 for the characteristics of leak current versus applied voltage. The non-linear dielectric thin film 5 of the variable capacitor 4 used for the measurement is made of a BST film as a material and baked at a temperature of 700° C. by a sol-gel technique. The electrodes 6 and 7 are made of Pt/Ta (a laminated layer of Pt and Ta).

As FIG. 10 shows, the leak current of the variable capacitor 4 is extremely low, and it is understood that the material and film forming method mentioned above are effectual.

Also, as described above, the capacity C of the variable capacitor 4 can be obtained from Equations (1) to (7). The capacity C satisfies Equation:

$$C = \epsilon r \cdot S/t \tag{8}$$

where S is the area of the upper electrode constituting the capacitor, or in other words, the area of the opening 17a where the insulating film 17 is not formed over the non-linear dielectric thin film 5, t is the thickness of the non-linear dielectric thin film 5, and $\epsilon r$ is the relative dielectric constant of the non-linear dielectric thin film 5.

If above mentioned BST or STO is used for a material of the non-linear dielectric thin film 5, the relative dielectric constant $\epsilon r$ is about 300. The value is extremely large compared to a case where such a material as $SiO_2$ is used. Therefore, since the use of such materials as mentioned above results in a smaller S/t still producing the same capacity C, the non-linear dielectric thin film 5 can be made smaller in the area thereof.

Also, as described above, an electric field as strong as ±1 MV/cm is applied across the non-linear dielectric thin film 5 so as to change the relative dielectric constant $\epsilon r$. The thinner the thickness t of the non-linear dielectric thin film 5, the stronger the applied electric field produced by applying a low voltage is. This makes it possible to reduce the thickness t and hereby manufacture a thin type of non-linear dielectric thin film 5, i.e. a much smaller type of non-linear dielectric thin film 5.

As described above, the relative dielectric constant $\epsilon r$ of the non-linear dielectric thin film 5 is variable not less than 60%. Therefore, 30% thereof may be used for impedance matching, i.e., as a variable range of the impedance Z2, while the remaining 30% may be used for compensating for the irregularity in dimension precision of the capacitor that is likely to be caused by the reduction of the non-linear dielectric thin film 5 in size. This eases requirements on design and manufacture precision of the non-linear dielectric thin film 5.

In other words, the variable capacitor 4 may be arranged to compensate, using part of the change in the capacity C caused by a change in the relative dielectric constant of the non-linear dielectric thin film 5, for an irregularity in the capacity C caused by irregularity in design and manufacture. The irregularity in the capacity refers to the difference between the actual capacity and the capacity predetermined in design of the variable capacitor 4 of the impedance matching device 1.

Also, as described above, the thinner the thickness t of the non-linear dielectric thin film 5, the stronger the applied electric field produced by applying a low voltage is. However, in the light of crystallinity, convexities, concavities, and pin holes of the bed substrate, it is believed that the thickness t has a lower limit of about 0.05 $\mu$m. Assuming that the practical upper limit for the applied voltage is 100V, the upper limit of the thickness t is 10 $\mu$m.

The impedance matching device 1 can be thus realized equipped with the variable capacitor 4 having a capacity variable according to the applied DC control voltage. Then by changing the DC control voltage applied across the variable capacitor 4, a capacity can be realized easily that has the reactance in accordance with the impedance to be matched.

This enables the impedance matching device 1 to be capable of matching impedance with a smaller and cheaper arrangement. In addition, desired characteristics as shown in FIGS. 5 and 6 can be realized with high precision by merely applying a control voltage in accordance with the characteristics of the variable capacitor 4, easing requirements on design and manufacture precision. Moreover, the impedance matching device 1 has an extremely small temperature coefficient and still maintains stable characteristics, compared to variable capacitors using semiconductor.

Furthermore, as to the impedance matching device 1, after printing and thus forming the non-linear dielectric thin film 5 on the lower electrode 6 that acts as a bed conductor, the portion of the printed non-linear dielectric thin film 5 extending over the lower electrode 6 is removed by a photo etching technique, or preferably a lift-off technique, only leaving the portion that will fabricated into the variable capacitor 4.

Therefore, the impedance matching device 1 includes an arrangement of the non-linear dielectric thin film 5 formed on a flat conductor surface, thereby being capable of restraining the leak current and realizing a satisfactory insulation withstand voltage. That arrangement also restrains possible irregularity in the capacity of the variable capacitor 4, imparting desirable characteristics.

Also, as to the impedance matching device 1, the electrode 7 that acts as the upper electrode is formed after the outer circumferential edge of the non-linear dielectric thin film 5 is covered with the insulating film 17 having a small dielectric constant. Therefore, the impedance matching device 1 restrains the leak current and increases the insulation withstand voltage.

Moreover, even when the relative dielectric constant εr of the non-linear dielectric thin film 5 is large, the impedance matching device 1 still can reduce the capacity of the variable capacitor 4 by forming the opening 17a of the insulating film 17 with an extremely small area of, for example, 0.1 mm×0.1 mm. Consequently, a desirable small capacity suitable for high frequency can be obtained with good reproducibility.

The following description will discuss a second embodiment in accordance with the present invention. Here, for convenience, members of the present embodiment that have the same arrangement and function as members of the previous embodiment, and that are mentioned in the previous embodiment are indicated by the same reference numerals and description thereof is omitted.

Figure 11:
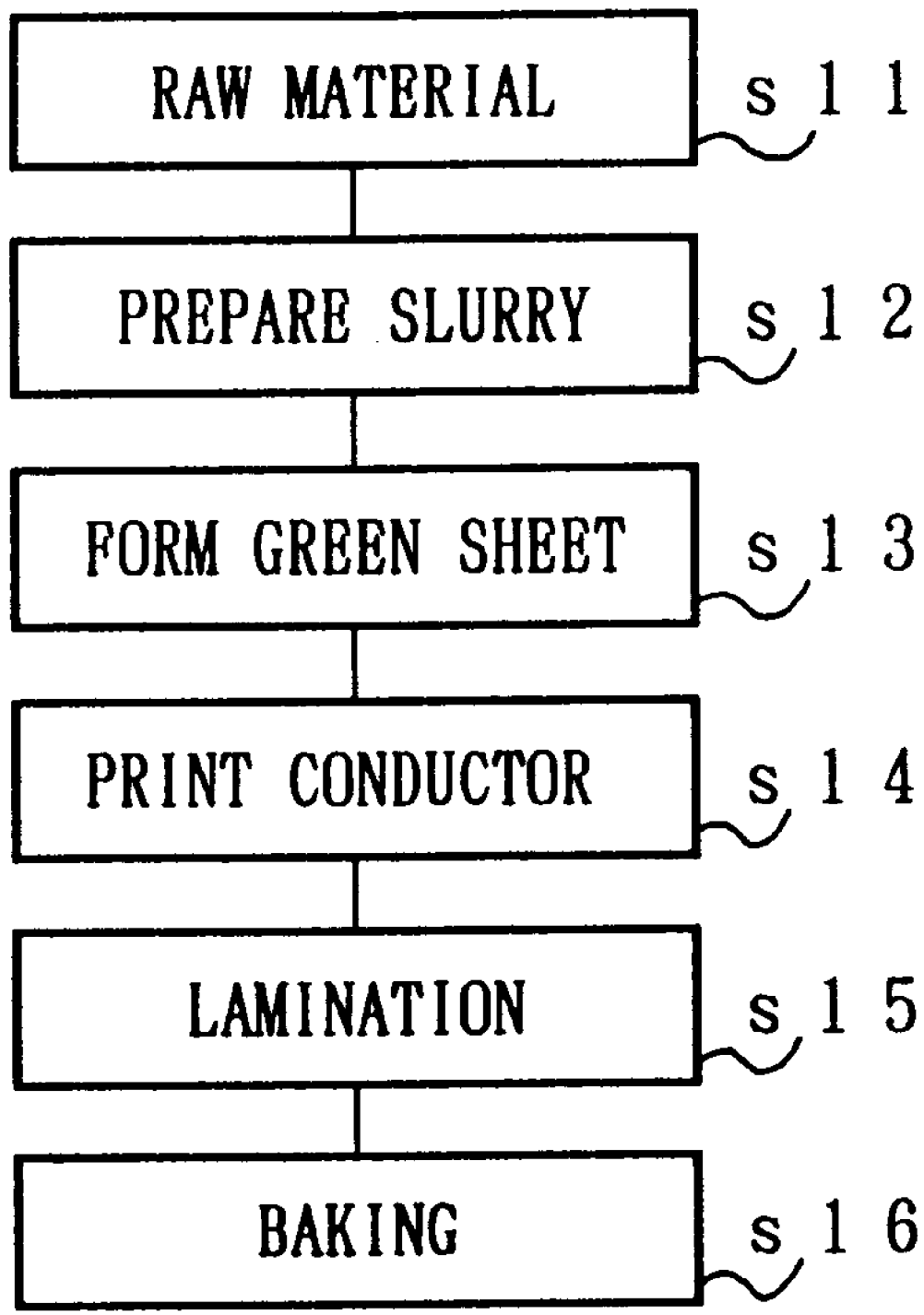
FIG. 11 is a flow block diagram illustrating a manufacturing process of a non-linear dielectric thin film of an impedance matching device of the second embodiment in accordance with the present invention.

In the present embodiment will be explained a manufacturing process of the non-linear dielectric thin film 5 detailed in the first embodiment by a print lamination technique. FIG. 11 is a flow block diagram illustrating the manufacturing process. As FIG. 11 shows, in Step s11, a raw material is prepared by baking using a temporary baker and grinding using a grinder. In Step s12, the raw material is made into slurry by a ball mill and a stirring vacuum dearator. In Step s13, the raw material made into slurry is shaped into a green sheet. In Step s14, conductors including the electrodes 6 and 7 are formed on the green sheet formed in Step s13 by printing. In Step s15, the green sheet is laminated by a sheet press machine. In Step s16, the laminated green sheet is baked by a baker, which completes the manufacturing process of the non-linear dielectric thin film 5.

The formation of the non-linear dielectric thin film 5 by a conventional green sheet process in the above manner can reduce the number of steps that need to be newly developed, and makes it possible to cut down the impedance matching device 1 in size, since the non-linear dielectric thin film 5 can be formed integrally with the substrate 14. Incidentally, the non-linear dielectric thin film 5 may be constituted by either a single or a plurality of green sheets: for example, if the non-linear dielectric thin film 5 needs to be formed relatively thick, two or more green sheets may be laminated on the substrate 14.

As discussed so far, a first impedance matching device in accordance with the present invention is an impedance matching device mounted on a high frequency circuit substrate, and is arranged to include:

a voltage-controlled variable capacitor including,
  a non-linear dielectric thin film having a relative dielectric constant that varies in accordance with a strength of an applied electric field,
  a first electrode formed on one of the sides of the non-linear dielectric thin film, and
  a second electrode formed on the opposite side of the non-linear dielectric thin film; and
a control voltage application section for applying a control voltage across the first and second electrodes,
wherein the voltage-controlled variable capacitor is for receiving the control voltage and a high frequency signal for generating an electric field across the two electrodes.

With the arrangement, as a DC control voltage is applied across the electrodes, the relative dielectric constant of the non-linear dielectric thin film varies. Therefore, the capacity and, hence, the impedance of the voltage-controlled variable capacitor including the non-linear dielectric thin film can be set to a desirable value in accordance with the high frequency signal flowing through the two electrodes.

In other words, the first impedance matching device above includes on a high frequency circuit substrate a voltage-controlled variable capacitor constituted by a non-linear dielectric thin film that is flanked by two electrodes and that has a relative dielectric constant variable in accordance with a strength of an applied electric field. The relative dielectric constant of the non-linear dielectric thin film is changed by the control voltage application means applying a DC control voltage across the two electrodes. Therefore, the capacity and, hence, the impedance of the voltage-controlled variable capacitor can be set to a desirable value in accordance with the high frequency signal flowing through the two electrodes.

The conventional MCM (Multi-Chip Module) technology of forming a desirable circuit by mounting chip components on a ceramic substrate requires replacement of such chip components, as an L, C, and R, and physical adjustment to match impedances between circuit blocks.

By contrast, the first impedance matching device above can always produce a desirable impedance simply by the control voltage application section changing the control voltage according to temperature variations and effects from the user. This facilitates design and adjustment of high frequency circuits.

In addition, if the non-linear dielectric thin film is made of an oxidized material such as $BaTiO_3$, $SrTiO_3$, or $BaSrTiO_3$, a non-linear dielectric thin film can be formed on a ceramic substrate that produces little signal delay and that is suitable to act as a high frequency circuit substrate, by baking integrally with other passive parts like a capacitor, a coil, and a resistor. This makes it possible to cut down the impedance matching device in size and cost.

A second impedance matching device in accordance with the present invention, incorporating the arrangement of the first impedance matching device above, is further arranged so that the non-linear dielectric thin film is made of $BaTiO_3$, $SrTiO_3$, or $Ba_xSr_{1-x}TiO_3$ (0<x<1).

With the arrangement, those materials can produce a variation of a greater extent in the relative dielectric constant in response to a predetermined applied voltage than other non-linear dielectric materials. $Ba_xSr_{1-x}TiO_3$ is especially suitable because it produces a variation of a great extent in the relative dielectric constant and a small leak current. Also with the arrangement, the non-linear dielectric thin film is made of an oxidized film. Therefore, the non-linear dielectric thin film can be formed integrally with other passive parts like a capacitor, a coil, and a resistor by a ceramic lamination process for a high frequency circuit substrate. Moreover, the conventional process of forming a ceramic substrate can be adopted through modification thereof by the mere addition of the step of forming the non-linear dielectric thin film, reducing the number of steps that need to be newly developed.

Furthermore, a third impedance matching device in accordance with the present invention, incorporating the arrangement of the second impedance matching device above, is further arranged so that the non-linear dielectric thin film has a thickness of 0.05 μm to 10 μm.

An exceedingly thick non-linear dielectric thin film would result in too large an applied voltage required to produce a variation of a desired extent in the relative dielectric constant. Meanwhile, an exceedingly thin non-linear dielectric thin film would result in an larger leak current due to the creation of pin holes by convexities and concavities in the bed and defects on the surface. By contrast, if the non-linear dielectric thin film has a thickness in the above-mentioned range, the variation of a desirable extent in the relative dielectric constant can be realized with a low applied voltage and a small leak current.

A fourth impedance matching device in accordance with the present invention, incorporating any of the arrangements of the first to third impedance matching devices above, is further arranged so that the non-linear dielectric thin film is formed directly on a high frequency circuit substrate made of a dielectric ceramic substrate or a glass substrate by a deposition, printing, or sol-gel technique using an organic metal salt.

With the arrangement, the desirable extremely thin non-linear dielectric thin film can be formed by a simple process.

A fifth impedance matching device in accordance with the present invention, incorporating the arrangement of the fourth impedance matching device above, is further arranged so that the non-linear dielectric thin film is formed by a photo etching technique, or preferably a lift-off technique.

With the arrangement, the outer circumferential edge of the non-linear dielectric thin film is removed that extends over the bed electrode formed as a thick film and that does not affect the variable capacity.

Consequently, only the portion, of the printed non-linear dielectric thin film, formed uniformly on the bed electrode is used for the variable capacity. This makes it possible to restrain leak current and realize a substantial insulation withstand voltage. This also makes it possible to restrain irregularity in capacity, producing desirable properties.

A sixth impedance matching device in accordance with the present invention, incorporating the arrangement of the fourth or fifth impedance matching device above, is further arranged so that the non-linear dielectric thin film has an outer circumferential edge covered with an insulating film made of a material having a low relative dielectric constant.

With the arrangement, the upper electrode is formed after the insulating film is formed to cover the outer circumferential edge of the non-linear dielectric thin film, where the non-linear dielectric thin film is likely to be non-uniform. This makes it possible to restrain leak current and realize a substantial insulation withstand voltage. This also makes it possible to restrain irregularity in capacity, producing desirable properties.

A seventh impedance matching device in accordance with the present invention, incorporating any of the arrangements of the first to third impedance matching devices above, is further arranged so that the non-linear dielectric thin film is formed on the high frequency circuit substrate by a ceramic green sheet process.

With the arrangement, the non-linear dielectric thin film can be formed integrally on the high frequency circuit substrate by a conventional green sheet process. This can reduce the number of steps that need to be newly developed.

An eighth impedance matching device in accordance with the present invention, incorporating any of the arrangements of the first to seventh impedance matching devices above, is further arranged so that the electrodes are thick film conductive bodies formed with the skin thicknesses thereof taken into consideration.

With the arrangement, the desirable electric properties including capacity can be surely imparted to the voltage-controlled variable capacitor even when the high frequency signals to be handled have high frequencies.

The invention being thus described, it will be obvious that the same may be varied in many ways. Such variations are not to be regarded as a departure from the spirit and scope of the invention, and all such modifications as would be obvious to one skilled in the art intended to be included within the scope of the following claims.

What is claimed is:

1. An impedance matching device incorporated in a high frequency circuit board, comprising:
    a voltage-controlled variable capacitor including
        a non-linear dielectric thin film having a relative dielectric constant in accordance with a strength of an applied electric field,
        a first electrode formed on one of the sides of the non-linear dielectric thin film, and
        a second electrode formed on an opposite side of the non-linear dielectric thin film; and
    a control voltage application section for applying a control voltage across the first and second electrodes,
    one of the first and second electrodes receiving a high frequency signal as an input and another of the first and second electrodes providing a high frequency signal as an output.

2. The impedance matching device as set forth in claim 1, wherein the non-linear dielectric thin film is made of $BaTiO_3$, $SrTiO_3$, or $Ba_xSr_{1-x}TiO_3$ (0<x<1).

3. The impedance matching device as set forth in claim 2, wherein the non-linear dielectric thin film has a uniform thickness in a range of 0.05 $\mu$m to 10 $\mu$m.

4. The impedance matching device as set forth in claim 1, wherein the non-linear dielectric thin film is formed directly on a high frequency circuit substrate made of a dielectric ceramic substrate or a glass substrate.

5. The impedance matching device as set forth in claim 4, wherein the non-linear dielectric thin film is formed directly on the high frequency circuit substrate by a deposition technique, a printing technique, or a sol-gel technique using an organic metal salt.

6. The impedance matching device as set forth in claim 5, wherein the non-linear dielectric thin film is formed by a photo etching technique.

7. The impedance matching device as set forth in claim 6, wherein the photo etching technique is a lift-off technique.

8. The impedance matching device as set forth in claim 1, wherein the non-linear dielectric thin film is made of $Ba_xSr_{1-x}TiO_3$ (0<x<1) by a sol-gel technique.

9. The impedance matching device as set forth in claim 5, wherein the non-linear dielectric thin film has an outer circumferential edge covered with an insulating film made of a material having a low relative dielectric constant.

10. The impedance matching device as set forth in claim 9, wherein the insulating film is made of $SiO_2$ or $Al_2O_3$.

11. The impedance matching device as set forth in claim 1, wherein the non-linear dielectric thin film is formed on a high frequency circuit substrate by a ceramic green sheet process.

12. The impedance matching device as set forth in claim 1, wherein the first and second electrodes each are a thick film conductive body each having a thickness in accordance with a frequency range of the high frequency signal.

13. The impedance matching device as set forth in claim 12, wherein the first and second electrodes each are made of a laminated layer of Pt and Ta.

14. The impedance matching device as set forth in claim 1,
wherein the voltage-controlled variable capacitor has a capacity that is specified to change with a relative dielectric constant of the non-linear dielectric thin film, so as to compensate for an irregularity in design and manufacture of the capacity of the voltage-controlled variable capacitor.

15. An impedance matching device, comprising:
a voltage-controlled variable capacitor, for receiving an input signal, including
a non-linear dielectric thin film having a relative dielectric constant in accordance with a strength of an applied electric field,
a first electrode formed on one of the sides of the non-linear dielectric thin film, and
a second electrode formed on an opposite side of the non-linear dielectric thin film; and
a control voltage application section for applying a control voltage across the first and second electrodes,
the non-linear dielectric thin film having an outer circumferential edge covered with an insulating film made of a material having a low relative dielectric constant.

16. The impedance matching device of claim 15, wherein the insulating film is made of $SiO_2$ or $Al_2O_3$.

17. A method of matching an impedance comprising the steps of:
providing a non-linear thin-film dielectric between first and second electrodes, the first and second electrodes being thick films;
applying a high frequency input signal to one of the first and second electrodes;
applying a control voltage across the first and second electrodes to selectively vary a dielectric constant of the non-linear thin-film dielectric; and
providing a high frequency output signal from another of the first and second electrodes,
the dielectric constant being selectively varied by the control voltage so that a capacity between the first and second electrodes has a reactance matching a desired impedance.

18. The method of impedance matching of claim 17, further comprising the step of covering an outer circumferential edge of the non-linear thin-film dielectric with an insulating film having a low relative dielectric constant.

19. The method of impedance matching of claim 18, wherein the insulating film is $SiO_2$ or $Al_2O_3$.

20. The method of impedance matching of claim 17, wherein thicknesses of the first and second electrodes are selected in accordance with a frequency range of the high frequency input signal.

* * * * *